United States Patent [19]

Yamada

[11] Patent Number: 4,791,295

[45] Date of Patent: Dec. 13, 1988

[54] METHOD AND APPARATUS FOR AUTOMATICALLY CORRECTING ASTIGMATISM OF SCANNING ELECTRON MICROSCOPE OR THE LIKE

[75] Inventor: Mitsuru Yamada, Tokyo, Japan

[73] Assignee: JEOL Ltd., Tokyo, Japan

[21] Appl. No.: 154,050

[22] Filed: Feb. 9, 1988

[30] Foreign Application Priority Data

Feb. 16, 1987 [JP] Japan .................................. 62-32896

[51] Int. Cl.$^4$ .......................................... H01J 37/153
[52] U.S. Cl. ..................... 250/310; 250/311; 250/306; 250/309; 250/397; 250/307; 250/396 ML
[58] Field of Search ............... 250/307, 310, 311, 397, 250/396 ML, 309, 306

[56] References Cited

U.S. PATENT DOCUMENTS 4,214,163  7/1980  Namae et al. ........................ 250/311
4,392,054  7/1983  Sato et al. ............................ 250/307
4,567,369  1/1986  Smith et al. ........................ 250/310

Primary Examiner—Bruce C. Anderson
Assistant Examiner—Jack I. Berman
Attorney, Agent, or Firm—Webb, Burden, Ziesenheim & Webb

[57] ABSTRACT

An apparatus using an electron beam for repeatedly scanning a specimen. The apparatus has an xy stigmator equipped with x-axis and y-axis coils to which correcting currents $I_x$ and $I_y$ are respectively fed. The values of these correcting currents are systematically varied for every scan. The signal emanating from the specimen is converted into a signal D indicating the diameter of the beam moving in a direction during each scan. When the signal D indicates that the diameter of the beam assumes its minimum value, the values of the correcting currents fed to the x-axis and y-axis coils are determined about two perpendicular directions of scan. The combinations of these values are referred to as $I_{xa}$, $I_{ya}$ and $I_{xb}$, $I_{yb}$. Finally, the correcting currents $I_x$, $I_y$ fed to the coils are set to $(I_{xa}+I_{xb})/2$ and $(I_{ya}+I_{yb})/2$, respectively.

3 Claims, 3 Drawing Sheets

METHOD AND APPARATUS FOR AUTOMATICALLY CORRECTING ASTIGMATISM OF SCANNING ELECTRON MICROSCOPE OR THE LIKE

FIELD OF THE INVENTION

The present invention relates to a method and an apparatus for automatically correcting the astigmatism of a scanning electron microscope or other similar apparatus in which an electron beam is scanned.

BACKGROUND OF THE INVENTION

Generally, it is quite important for a scanning electron microscope or other similar apparatus using an electron beam to correct the astigmatism of the electron optical system, for focusing the electron beam impinging upon a sepcimen to a narrow beam. U.S. Pat. No. 4,214,163 discloses a method of automatically correcting the astigmatism of a scanning electron microscope. In brief, this known method comprises the steps of: (a) making the correcting currents used in the stigmator equal to zero; (b) varying the lens current without altering the astigmatism produced by the lenses; (c) finding the value of lens current at which the electron beam upon the specimen assumes the shape of a circle of least confusion; (d) maintaining the lens current at the found value; and (e) independently and automatically adjusting the correcting currents fed to X-axis and Y-axis coils of the xy stigmator so as to minimize the size of the circle of least confusion.

In the step (c) of the known correcting method, the electron beam upon the specimen surface is shaped into a circle of least confusion and, therefore, it is necessary to vary the lens current at minute steps over a wide range. However, it is difficult to vary the lens current at a high speed, because the inductance of the lens coils is large. Consequently, it takes a long time to carry out the step (c) above. Hence, it is inevitable that a long time is required to perform this series of operations.

SUMMARY OF THE INVENTION

It is a main object of the present invention to provide a method and an apparatus for automatically correcting the astigmatism of a scanning electron microscope or the like in a short time.

The method according to this invention is now briefly described. First, electric currents $I_x$ and $I_y$ fed to two sets of stigmator coils, respectively, are set to their initial values. As shown in FIG. 1(a), a specimen S is scanned once with an electron beam along a line in the direction indicated by the arrow a. During the scan the $I_x$ and $I_y$ currents to the stigmator are a function of the x and y scanning signals. Also, during this scan, secondary electrons, reflected electrons, and so on emanate from the specimen. These electrons are detected, and the resulting signal is arithmetically processed to convert the signal into a signal indicating the diameter of the beam moved in the direction indicated by the arrow a. As an example of the signal processing, the detector output signal is differentiated. Then, the absolute value of the resulting signal is integrated. The obtained value D indicates the diameter of the beam moving in the direction indicated by the arrow a when the correcting currents $I_x$ and $I_y$ are fed to the coils. As the value D increases, the diameter of the beam decreases. The value D derived by the integration is stored in a memory.

The aforementioned measurement is repeated while systematically varying the values of the currents $I_x$ and $I_y$. As a result, an $I_x$-$I_y$-D map regarding the direction of scan indicated by the arrow a is formed in the memory as shown in FIG. 2(a). A point $P_a[I_{xa}, I_{ya}]$ at which the value D assumes its maximum value $D_{max-a}$ is determined from the map.

Then, the direction of scan is changed to the direction which is indicated by the arrow b (see FIG. 1(b) and perpendicular to the direction indicated by the arrow a. The $I_x$ and $I_y$ currents to the stigmator are again a function of the x and y scanning signals. An $I_x$-$I_y$-D map (FIG. 2(b)) regarding the direction of scan indicated by the arrow b is created in the same manner as the foregoing. A point $P_b [I_{xb}, I_{yb}]$ at which the value D takes its maximum value $D_{max-b}$ is determined from the map.

Where the correcting currents fed to the coils satisfy the condition of the point $P_a$, the diameter of the beam upon the specimen is minimal if it is measured in the direction indicated by the arrow a, as shown in FIG. 3(a). On the other hand, where the correcting currents supplied to the coils meet the condition of the point $P_b$, the diameter of the beam upon the specimen is minimal if it is measured in the direction indicated by the arrow b as shown in FIG. 3(b).

The present invention is characterized in that a point $P_c [I_{xc}, I_{yc}]$ equally distant from the abovedescribed points $P_a$ and $P_b$ is set to attain optimum compensation and that currents of $I_{xc}$ $(=(I_{xa}+I_{xb})/2)$ and $I_{yc}(=(I_{ya}+I_{yb})/2)$ are fed to the stigmator coils, respectively, as optimum correcting currents, as shown in FIG. 2(c).

The present inventor conducted experiments upon specimens of various shapes, and have found that for almost every specimen the astigmatism can be almost completely corrected by supplying correcting currents so as to achieve the intermediate point $P_c$.

In this way, when the astigmatism is corrected in accordance with the invention, only the correcting currents fed to the coils are varied; it is not necessary to change the lens current. Since the inductance of the stigmator coils is much smaller than that of the lens colis, it is possible to vary the correcting currents at a high speed. This makes it possible to obtain two $I_x$-$I_y$-D maps quickly. Consequently, it takes only a short time to carry out the whole experiment.

DESCRIPTION OF THE PREFERRED EMBODIMENTS

Figure 4:
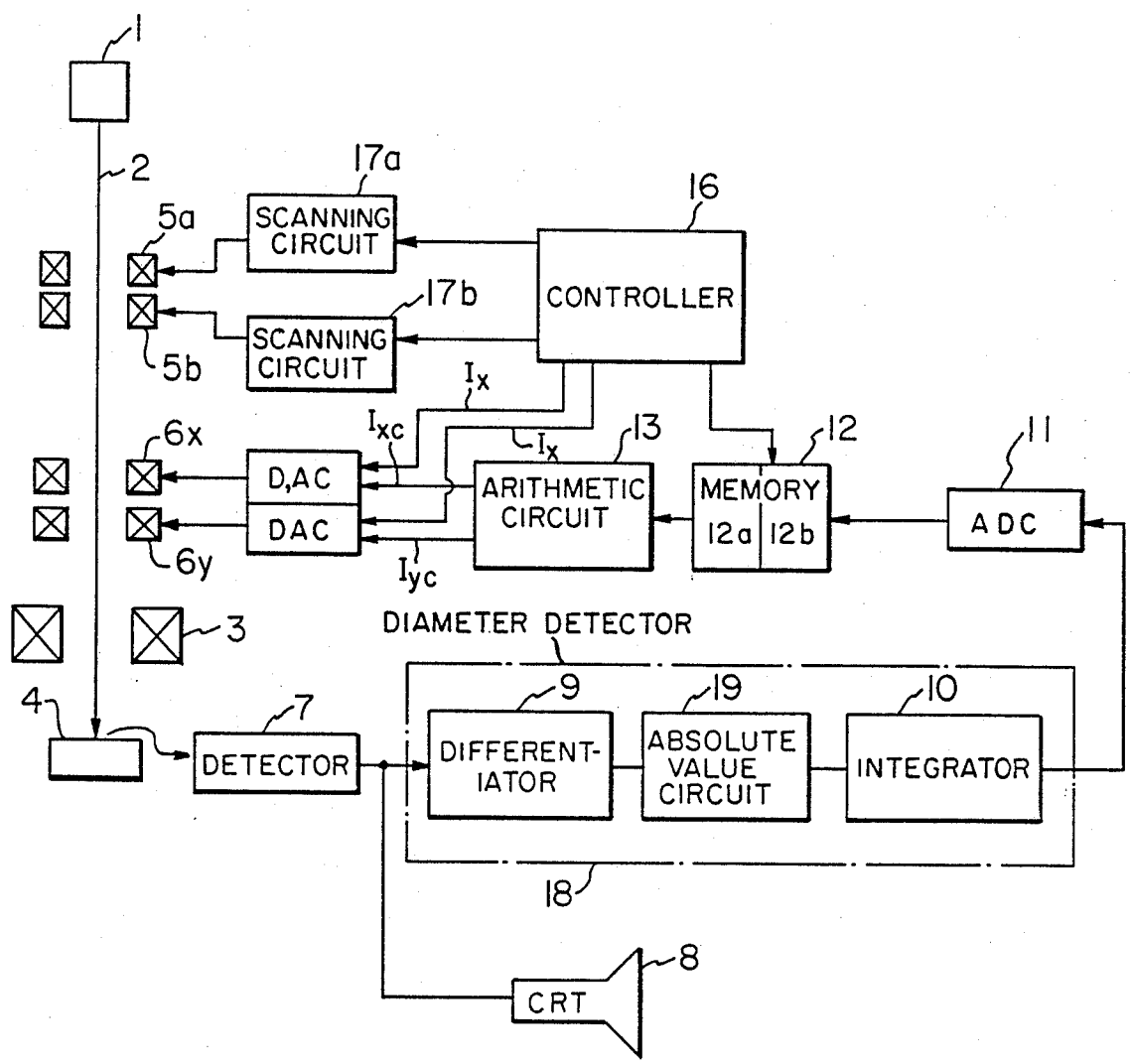
FIG. 4 is a block diagram of an apparatus according to the invention.

Referring to FIG. 4, there is shown a scanning electron microscope according to the present invention. This microscope includes an electron gun 1 that produces an electron beam 2. This beam 2 passes through scanning coils 5a, 5b and stigmator coils 6X and 6Y, is focused to a narrow beam by a focusing lens 3, and impinges upon a specimen 4. The specimen 4 is scanned with the beam by the scanning coils 5a and 5b which receive scanning signals from scanning circuits 17a and 17b, respectively.

Secondary electrons, reflected electrons, etc. emanate from the spot on the specimen 4 at which it is bombarded with the electron beam. These electrons are detected by a detector 7. The output signal from the detector 7 is supplied to a monitoring CRT 8 as an intensity-modulating signal and also to a beam diameter-detecting circuit 18 comprising a differentiator circuit 9, an absolute-value circuit 19, and an integrator circuit 10. The output signal from the detecting circuit 18 is fed via an analog-to-digital converter 11 to a memory 12 and stored there. An arithmetic circuit 13 calculates data about the optimum values of correcting currents from the data stored in the memory 12. The data about the optimum values is fed to digital-to-analog coverters 14X and 14Y for energizing the coils 6X and 6Y, respectively. The scanning circuits 17a, 17b, the D/A converters 14X, 14Y, and the memory 12 operate under the control of a controller 16.

Figure 5:
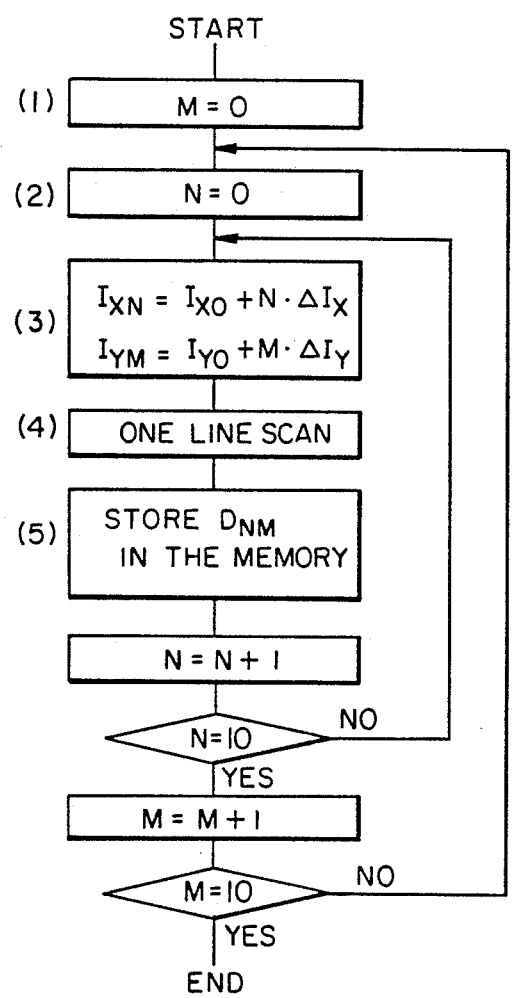
FIG. 5 is a flowchart for illustrating a series of operations for creating a map.

In the operation of the apparatus constructed as described above, the controller 16 first prepares an $I_x$-$I_y$-D map regarding a scan made in the direction indicated by the arrow a, in the manner as illustrated in the flowchart of FIG. 5. Variables M and N are first set to O (steps 1 and 2). Correcting currents $I_{XN}$ and $I_{YM}$ which are supplied to the coils 6X and 6Y from the D/A converters 14X and 14Y, respectively, are set to their initial values $I_{xO}$ and $I_{yO}$ under instruction of the controller 16 (step 3). The correcting currents are given by $$I_{XN} = I_{xO} + N \cdot \Delta I_x$$

$$I_{YM} = I_{y0} + M \cdot \Delta I_y$$

where $\Delta I_x$ and $\Delta I_y$ are the increments of the correcting currents, respectively.

The scanning circuit 17a, which is controlled by the controller 16, causes the electron beam to make one scan of the specimen along a line in the direction indicated by the arrow a (step 4). The output $D_{00}$ from the beam diameter-detecting circuit 18 which is produced at the end of the scan is stored in a storage block 12a of the memory 12 (step 5).

Figure 6:
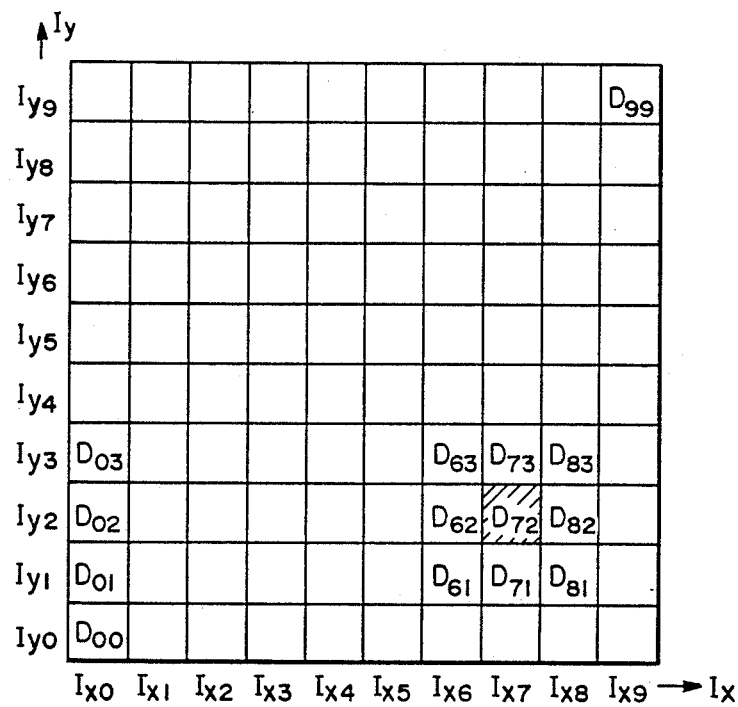
FIG. 6 is a diagram showing an $I_x$-$I_y$-D map made up of data items $D_{00}$-$D_{99}$ formed in a memory.

The steps 3–5 are each repeated 100 times until N and M reach 9. As a result, an $I_x$-$I_y$-D map as shown in FIG. 6 is formed in the block 12a of the memory 12, the map being associated with the scan made in the direction indicated by the arrow a. The map consists of data items $D_{00}$-$D_{99}$.

Figure 1A:
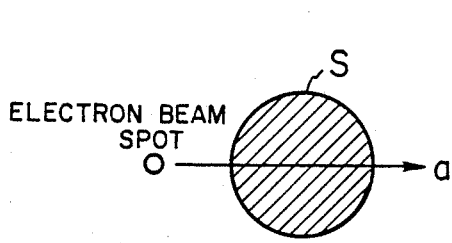
FIGS. 1(a) and 1(b) are diagrams for illustrating directions in which a specimen is scanned with an electron beam, the directions being indicated by the arrows a and b, respectively.
Figure 1B:
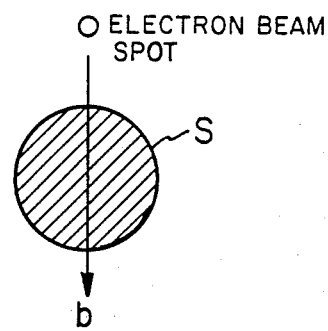
Figure 2A:
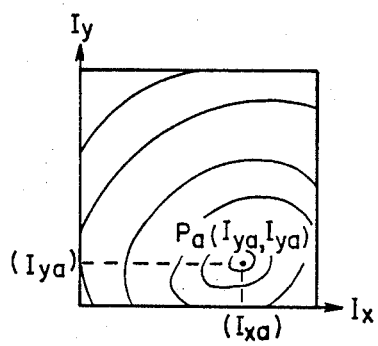
FIGS. 2(a) and 2(b) are diagrams of $I_x$-$I_y$-D maps regarding the directions of scan indicated by the arrows a and b, respectively.
Figure 2B:
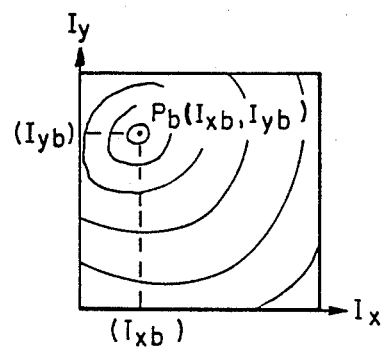
Figure 2C:
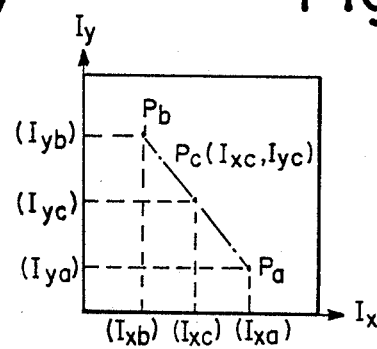
FIG. 2(c) is a diagram for illustrating a point $P_c$ at which optimum correcting currents $I_{xc}$ and $I_{yc}$ are produced.
Figure 3A:
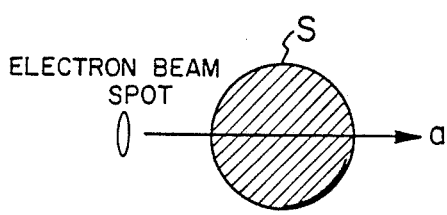
FIGS. 3(a) and 3(b) are diagrams for illustrating the shapes of an electron beam impinging upon a specimen when the correcting currents satisfy the conditions of points $P_a$ and $P_b$, respectively.
Figure 3B:
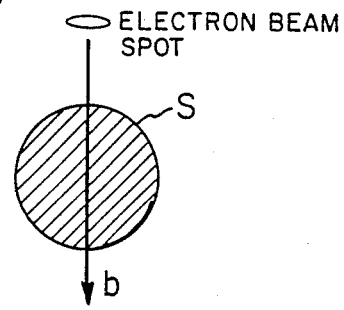

Then, the controller 16 creates an $I_x$-$I_y$-D map regarding a scan made in the direction indicated by the arrow b, in a storage block 12b of the memory 12 in exactly the same manner as in the above-described steps. Subsequently, the arithmetic circuit 13 finds the maximum values $D_{max-a}$ and $D_{max-b}$ of the D's of the two $I_x$-$I_y$-D maps. Thus, points $P_a$ [$I_{xa}$, $I_{ya}$] and $P_b$ [$I_{xb}$, $I_{yb}$] at which the D's assume their maximum values are determined. The arithmetic circuit 13 then calculates $I_{xc}(=(I_{xa}+I_{xb})/2)$ and $I_{yc}(=(I_{ya}+I_{yb})/2)$ which are continuously supplied to the D/A converters 14X and 14Y, respectively. Therefore, the correcting currents $I_{xc}$ and $I_{yc}$ fed to the correcting coils 6X and 6Y are retained at $I_{xc}$ and $I_{yc}$, respectively. Under this condition, the point $P_c$ shown in FIG. 2(c) has been reached, and the astigmatism has been almost fully corrected as mentioned previously. If a focusing operation is needed, then it is performed after the correcting operation.

While the invention has been described in its preferred embodiment, it is to be understood that variations thereto will occur to those skilled in the art within the scope of the present inventive concepts which are delineated by the appended claims. In the above example, each $I_x$-$I_y$-D map is made up of 10×10 data items obtained by sampling. Increasing the number of the data items will improve the accuracy with which the positions of $P_a$ and $P_b$ are determined. As a result, the astigmatism will be corrected more accurately. However, increasing the number of the sampling points prolongs the time taken to create the maps and so it is impossible to increase it inordinately.

The accuracy with which the positions of the peaks on the maps are determined can be enhanced without increasing the number of the sampling points inordinately, in the manner described below. It is now assumed that the maximum value of the $I_x$-$I_y$-D map obtained by a scan made in the direction indicated by the arrow a is $D_{72}$ as shown in FIG. 6. Considering also the values of $D_{61}$, $D_{62}$, $D_{63}$, $D_{71}$, $D_{73}$, $D_{81}$, $D_{82}$, $D_{83}$ surrounding $D_{72}$, the coordinates of the peak, i.e., $I_{xa}$ and $I_{ya}$, are determined under the conditions $$I_{x6} < I_{xa} < I_{x8}$$

$$I_{y1} < I_{ya} < I_{y3}$$

Conceivable methods include an arithmetic operation for finding the position of the center of gravity of the 9 points and various other approximations.

Also in the above example, all the data items which are obtained by sampling and form the $I_x$-$I_y$-D maps are stored in the memory. This is not always necessary to the invention. For instance, data items obtained from unwanted sampling points are discarded as soon as the measurement is complete. Finally, only the data about the map peak is allowed to remain.

Having thus described the invention with the detail and particularity required by the Patent Laws, what is claimed and desired to be protected by Letters Patent is set forth in the following claims.

What is claimed is:

1. A method of automatically correcting the astigmatism of a scanning electron microscope or other similar apparatus equipped with a focusing lens system for focusing an electron beam onto a specimen and equipped with an xy solenoid stigmator for correcting the astigmatism of the focusing lens system, comprising the steps of:
   (a) repeatedly scanning the specimen with the electron beam in a first direction;
   (b) systematically varying correcting currents $I_x$ and $I_y$ fed to the x-axis and y-axis coils, respectively, of the xy stigmator for every scan;

(c) converting the signal emanating from the specimen into a signal indicating the diameter of the electron beam in the direction of scan during each scan;

(d) forming a combination of the correcting currents $I_{xa}$ and $I_{ya}$ flowing into the x-axis and y-axis stigmator coils, respectively, when the converted signal indicates that the diameter of the beam in the first direction of scan is minimal;

(e) repeating the steps (b) and (c) after changing the direction of scan to a second direction substantially perpendicular to the first direction;

(f) forming a combination of the correcting currents $I_{xb}$ and $I_{yb}$ flowing into the x-axis and y-axis, respectively, when the converted signal indicates that the diameter of the beam in the second direction of scan is minimal; and (g) setting the correcting currents $I_x$ and $I_y$ fed to the x-axis and y-axis coils, respectively, substantially to $(I_{xa}+I_{xb})/2$ and $(I_{ya}+I_{yb})/2$, respectively.

2. A method of automatically correcting the astigmatism of a scanning electron microscope or other similar apparatus equipped with a focusing lens system for focusing an electron beam onto a specimen and equipped with an xy solenoid stigmator for correcting the astigmatism of the focusing lens system, comprising the steps of:

(a) scanning the specimen with the electron beam in a first direction;

(b) supplying correcting currents $I_x$ and $I_y$ to the x-axis and y-axis coils, respectively, of the xy stigmator;

(c) converting the signal emanating from the specimen into a signal D indicating the diameter of the electron beam in the direction of scan and storing the resulting data in a memory;

(d) forming a first $I_x$-$I_y$-D map regarding the first direction of scan by repeating the steps (b) and (c) while systematically varying the values of the correcting currents $I_x$ and $I_y$ fed to the x-axis and y-axis coils, respectively;

(e) forming a second $I_x$-$I_y$-D map regarding the second direction of scan perpendicular to the first direction of scan by repeating the steps (b) and (c) while systematically varying the values of the correcting currents $I_x$ and $I_y$ after changing the direction of scan to the second direction;

(f) finding such combinations of correcting currents $I_{xa}$, $I_{ya}$ and $I_{xb}$, $I_{yb}$ flowing into the x-axis and y-axis coils which minimize the diameter of the beam, based upon the two $I_x$-$I_y$-D maps, for both direction of scan; and (g) setting the correcting currents $I_x$ and $I_y$ fed to the x-axis and y-axis coils, respectively, substantially to $(I_{xa}+I_{xb})/2$ and $(I_{ya}+I_{yb})/2$, respectively.

3. An apparatus using an electron beam for scanning a specimen, said apparatus comprising:

(a) a focusing lens system for focusing the electron beam onto the specimen;

(b) an xy solenoid stigmator for correcting the astigmatism of the focusing lens system;

(c) a scanning means for repeatedly scanning the specimen with the beam;

(d) a converter means for converting the signal emanating from the specimen into a signal D indicating the diameter of the beam moving in a direction of scan;

(e) a means for systematically varying the values of the correcting currents $I_x$, $I_y$ fed to the x-axis and y-axis coils, respectively, of the stigmator for every scan and for obtaining $I_x$-$I_y$-D maps from the converted signals D;

(f) a means for finding such combinations of the correcting currents $I_{xa}$, $I_{ya}$ and $I_{xb}$, $I_{yb}$ fed to the x-axis and y-axis coils which minimize the diameter of the beam, based upon the two $I_x$-$I_y$-D maps regarding two perpendicular directions of scan; and (g) a means for setting the correcting currents fed to the x-axis and y-axis coils to $(I_{xa}+I_{xb})/2$ and $(I_{ya}+I_{yb})/2$, respectively.

* * * * *

UNITED STATES PATENT AND TRADEMARK OFFICE
CERTIFICATE OF CORRECTION

PATENT NO. : 4,791,295
DATED : December 13, 1988
INVENTOR(S) : Mitsuru Yamada

It is certified that error appears in the above-identified patent and that said Letters Patent is hereby corrected as shown below:

Column 2 Line 29 "abovedescribed" should read --above-described--.

Column 2 Line 45 "colis" should read --coils--.

Column 3 Line 38 "O" should read --0--.

Column 3 Line 42 "$I_{xO}$ and $I_{yO}$" should read --$I_{x0}$ and $I_{y0}$--.

Column 3 Line 44 "$I_{xO}$" should read --$I_{x0}$--.

Column 4 Line 1 "Ixb" should read --$I_{xb}$--.

Column 4 Line 37 "$1_{xa}$" should read --$I_{xa}$--.

Signed and Sealed this

Twenty-ninth Day of August, 1989

*Attest:*

DONALD J. QUIGG

*Attesting Officer*  *Commissioner of Patents and Trademarks*